(12) United States Patent
Jeon et al.

(10) Patent No.: US 10,008,635 B2
(45) Date of Patent: Jun. 26, 2018

(54) SEMICONDUCTOR LIGHT-EMITTING ELEMENT

(71) Applicant: SEMICON LIGHT CO., LTD., Gyeonggi-do (KR)

(72) Inventors: Soo Kun Jeon, Gyeonggi-do (KR); Il Gyun Choi, Gyeonggi-do (KR); Geun Mo Jin, Gyeonggi-do (KR)

(73) Assignee: SEMICON LIGHT CO., LTD., Gyeonggi-do (KR)

( * ) Notice: Subject to any disclaimer, the term of this patent is extended or adjusted under 35 U.S.C. 154(b) by 0 days. days.

(21) Appl. No.: 15/373,172

(22) PCT Filed: Jun. 10, 2015

(86) PCT No.: PCT/KR2015/005803
§ 371 (c)(1),
(2) Date: Dec. 8, 2016

(87) PCT Pub. No.: WO2015/190817
PCT Pub. Date: Dec. 17, 2015

(65) Prior Publication Data
US 2017/0186917 A1    Jun. 29, 2017

Related U.S. Application Data

(63) Continuation of application No. PCT/KR2015/005803, filed on Jun. 10, 2015.

(30) Foreign Application Priority Data

Jul. 10, 2014  (KR) .................. 10-2014-0086728

(51) Int. Cl.
*H01L 33/46*        (2010.01)
*H01L 33/08*        (2010.01)
(Continued)

(52) U.S. Cl.
CPC .............. *H01L 33/46* (2013.01); *H01L 33/08* (2013.01); *H01L 33/10* (2013.01); *H01L 33/12* (2013.01);
(Continued)

(58) Field of Classification Search
CPC ......... H01L 33/46; H01L 33/08; H01L 33/10; H01L 33/12; H01L 33/387; H01L 33/50; H01L 33/62; H01L 33/64
See application file for complete search history.

(56) References Cited

U.S. PATENT DOCUMENTS 7,262,436 B2   8/2007  Kondoh et al. .................. 257/94
9,236,419 B2 * 1/2016  Kim .................... H01L 51/5218
(Continued)

FOREIGN PATENT DOCUMENTS

JP       2008-135789       12/2008  ............. H01L 33/00

OTHER PUBLICATIONS

ISR dated Sep. 14, 2015 in PCT/KR2015/005803 published as WO 2015/190817.

*Primary Examiner* — Ida M Soward
(74) *Attorney, Agent, or Firm* — Harness, Dickey & Pierce, P.L.C.

(57) ABSTRACT

Disclosed is a semiconductor light emitting device including: a plurality of semiconductor layers; a non-conductive reflective film which is formed on the plurality of semiconductor layers; and first and second electrodes formed on the non-conductive reflective film, wherein a spacing between the first electrode and the second electrode is 80 μm or greater, and a ratio of a combined area of the first and second electrodes to a planform area of the semiconductor light emitting device as seen on a top view is 0.7:1 or less.

5 Claims, 15 Drawing Sheets

(51) Int. Cl.
*H01L 33/10* (2010.01)
*H01L 33/12* (2010.01)
*H01L 33/38* (2010.01)
*H01L 33/50* (2010.01)
*H01L 33/62* (2010.01)
*H01L 33/64* (2010.01)

(52) U.S. Cl.
CPC ............ *H01L 33/387* (2013.01); *H01L 33/50* (2013.01); *H01L 33/62* (2013.01); *H01L 33/64* (2013.01)

(56) References Cited

U.S. PATENT DOCUMENTS

| | | | | |
|---|---|---|---|---|
| 9,236,524 B2 * | 1/2016 | Jeon | ........................ | H01L 33/46 |
| 9,312,453 B2 * | 4/2016 | Park | ........................ | H01L 33/46 |
| 9,466,768 B2 * | 10/2016 | Jeon | ........................ | H01L 33/46 |
| 9,530,941 B2 * | 12/2016 | Jeon | ........................ | H01L 33/46 |
| 2014/0217439 A1 | 8/2014 | Jeon et al. | | |
| 2014/0291714 A1 * | 10/2014 | Jeon | ........................ | H01L 33/46 257/98 |
| 2016/0260869 A1 * | 9/2016 | Jeon | ........................ | H01L 33/38 |
| 2017/0125641 A1 * | 5/2017 | Jeon | ........................ | H01L 33/46 |

\* cited by examiner

SEMICONDUCTOR LIGHT-EMITTING ELEMENT

CROSS-REFERENCE TO RELATED APPLICATION

This application is a continuation application of PCT Application No. PCT/KR2015/005803, filed on Jun. 10, 2015, which claims benefit of Korean Patent Application No. 10-2014-0086728, filed on Jul. 10, 2014.

FIELD

The present disclosure relates generally to a semiconductor light emitting device, and more particularly, to a semiconductor light emitting device having reduced light loss.

In the context herein, the term "semiconductor light emitting device" is intended to indicate a semiconductor optoelectronic device which generates light by electron-hole recombination. One example thereof is a Group III-nitride semiconductor light emitting device, in which the Group III-nitride semiconductor is made of a compound containing $Al(x)Ga(y)In(1-x-y)N$ ($0 \le x \le 1$, $0 \le y \le 1$, $0 \le x+y \le 1$). Another example thereof is a GaAs-based semiconductor light emitting device used for emitting red light.

BACKGROUND

This section provides background information related to the present disclosure which is not necessarily prior art.

FIG. 1 shows an exemplary embodiment of the semiconductor light emitting device disclosed in U.S. Pat. No. 7,262,436, in which the semiconductor light emitting device includes a substrate 100, an n-type semiconductor layer 300 grown on the substrate 100, an active layer 400 grown on the n-type semiconductor layer 300, a p-type semiconductor layer 500 grown on the active layer 400, electrodes 901, 902 and 903 formed on the p-type semiconductor layer 500, with the electrodes serving as reflective films, and an n-side bonding pad 800 formed on the n-type semiconductor layer 300 which had been etched and exposed.

A chip having the above structure, i.e. a chip where all of the electrodes 901, 902 and 903, and the electrode 800 are formed on one side of the substrate 100, with the electrodes 901, 902 and 903 serving as reflective films, is called a flip chip. The electrodes 901, 902 and 903 are made up of an electrode 901 (e.g., Ag) having a high reflectance, an electrode 903 (e.g., Au) for bonding, and an electrode 902 (e.g., Ni) for preventing diffusion between materials of the electrode 901 and materials of the electrode 903. While this metal reflective film structure has a high reflectance and is advantageous for current spreading, it has the drawback that the metal absorbs light. In addition, even if the metal reflective film could serve as an electrode and heat-emission passage at the same time, it is not easy for the metal reflective film to serve as an electrode and have an excellent heat-emission structure at the same time.

FIG. 2 shows an exemplary embodiment of the semiconductor light emitting device disclosed in JP Laid-Open Pub. No. 2006-20913, in which the semiconductor light emitting device includes a substrate 100, a buffer layer grown on the substrate 100, an n-type semiconductor layer 300 grown on the buffer layer 200, an active layer 400 grown on the n-type semiconductor layer 300, a p-type semiconductor layer 500 grown on the active layer 400, a light transmitting conductive film 600 with a current spreading function, which is formed on the p-type semiconductor layer 500, p-side bonding pad 700 formed on the light transmitting conductive film 600, and an n-side bonding pad 800 formed on the n-type semiconductor layer 300 which had been etched and exposed. Further, a DBR (Distributed Bragg Reflector) 900 and a metal reflective film 904 are provided on the light transmitting conductive film 600. While this structure shows reduced light absorption by the metal reflective film 904, it has the drawback that current spreading is not facilitated, as compared with the structure using the electrodes 901, 902 and 903.

SUMMARY

Technical Problem

The problems to be solved by the present disclosure will be described in the latter part of the best mode for carrying out the invention.

Technical Solution

This section provides a general summary of the present disclosure and is not a comprehensive disclosure of its full scope or all of its features.

According to an aspect of the present disclosure, there is provided a semiconductor light emitting device including: a plurality of semiconductor layers sequentially formed on a growth substrate, the plurality of semiconductor layers including a first semiconductor having a first conductivity type, a second semiconductor layer having a second conductivity type different from the first conductivity type, and an active layer interposed between the first and second semiconductor layers and adapted to generate light by electron-hole recombination; a non-conductive reflective film which is formed on the plurality of semiconductor layers, and reflects the light generated from the active layer towards the growth substrate; a first electrode which is formed on the non-conductive reflective film, and electrically communicates with the first semiconductor layer to provide the first semiconductor layer with either electrons or holes; and a second electrode which is formed on the non-conductive reflective film, opposite to the first electrode, and electrically communicates with the second semiconductor layer to provide the second semiconductor layer with either electrons if holes are provided to the first semiconductor layer or holes if electrons are provided to the first semiconductor layer, wherein a spacing between the first electrode and the second electrode is 80 µm or greater, and a ratio of a combined area of the first and second electrodes to a planform area of the semiconductor light emitting device as seen on a top view is 0.7:1 or less.

Advantageous Effects

The advantageous effects of the present disclosure will be described in the latter part of the best mode for carrying out the invention.

DETAILED DESCRIPTION

Hereinafter, the present disclosure will now be described in detail with reference to the accompanying drawing(s).

Figure 3:
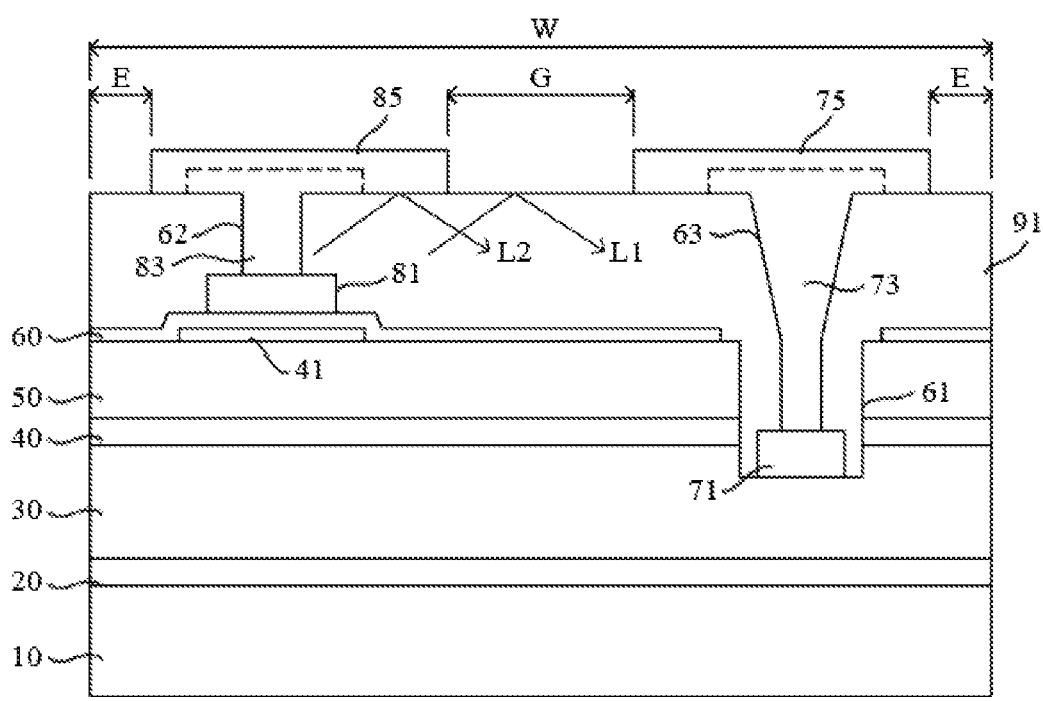
FIG. 3 shows an exemplary embodiment of a semiconductor light emitting device according to the present disclosure.

FIG. 3 shows an exemplary embodiment of a semiconductor light emitting device according to the present disclosure, in which the semiconductor light emitting device includes a substrate 10, a plurality of semiconductor layers, a light absorption barrier 41, a light transmitting conductive film 60, a non-conductive reflective film 90, a first electrode 75, a second electrode 85, a first electrical connection 73, a second electrical connection 83, a first lower electrode 71 and a second lower electrode 81. In the following description, a Group III-nitride semiconductor light emitting device is taken by way of example.

The substrate 10, which may eventually be removed, is typically made of sapphire, SiC, Si, GaN or the like. A first semiconductor layer 30 and a second semiconductor layer 50 can exchange their positions, and these semiconductor layers are typically made of GaN in the case of Group III-nitride semiconductor light emitting devices.

The plurality of semiconductor layers include a buffer layer 20 a first semiconductor layer 30 (e.g., Si-doped GaN) having a first conductivity type, a second semiconductor layer 50 (e.g., Mg-doped GaN) having a second conductivity type different from the first conductivity type, and an active layer 40 (e.g., InGaN/(In)/GaN multiple quantum well structure) which is interposed between the first semiconductor layer 30 and the second semiconductor layer 50 and generates light by electron-hole recombination. Each of the plurality of semiconductor layers 30, 40, 50 may have a multilayer structure, and the buffer layer 20 may be omitted.

The light absorption barrier 41 is formed on the second semiconductor layer 50, in correspondence with an opening 62. It may only serve to reflect a portion or all of the light generated from the active layer 40, or to block the current flowing directly below the second lower electrode 81, starting from the second lower electrode 81, or both. The light absorption barrier 41 may be omitted.

It is preferable that the light transmitting conductive film 60 is present. The light transmitting conductive film 60 is formed between the light absorption barrier 41 and the second lower electrode 81 in such a manner that it covers the entire or only a part of the second semiconductor layer 50. Particularly, considering that a p-type GaN has a poor current spreading capability, a p-type semiconductor layer 50 made of GaN usually needs a help from the light transmitting conductive film 60. For example, a material such as ITO, Ni/Au or the like can be used for the light transmitting conductive film 60.

The non-conductive reflective film 91 reflects the light from the active layer 40 towards the plurality of semiconductor layers 30, 40, 50. In this embodiment, the non-conductive reflective film 91 is formed on the plurality of semiconductor layers, using a non-conductive material to reduce light absorption by a metal reflective film. It is desirable that the non-conductive reflective film 91 functions as a reflective film, yet it is preferably made of light transmitting materials for avoiding light absorption. For example, it may be made of light transmitting dielectric materials such as $SiO_x$, $TiO_x$, $Ta_2O_5$, or $MgF_2$. When the non-conductive reflective layer 91 is made of $SiO_x$, it has a lower refractive index than the refractive index of the p-type semiconductor layer 50 (e.g. GaN) such that the light incident at a greater angle than the critical angle will partly be reflected towards the plurality of semiconductor layers 30, 40, 50. Meanwhile, when the non-conductive reflective film 91 is made of a DBR (Distributed Bragg Reflector) (e.g. DBR using the combination of $SiO_2$ and $TiO_2$), a greater amount of incident light will be reflected towards the plurality of semiconductor layers 30, 40, 50. The non-conductive reflective film also has openings 62, 63 formed therein.

The first lower electrode 71 is formed on an exposed portion of the first semiconductor layer 30 by etching the second semiconductor layer 50 and the active layer 40, and the second lower electrode 81 is formed on the light transmitting conductive film 60. In order to reduce light absorption by a metal, the lower electrode 71, 81 does not have an elongated form, but has an island form in correspondence with the openings 62, 63, and is partially exposed by the openings 62, 63.

The first electrode 75 and the second electrode 85 are formed on the non-conductive reflective film 91, opposite to each other with a certain distance between them. In this embodiment, the first electrode 75 provides electrons, and the second electrode provides holes. Needless to say, they could also function the other way around. The first electrical connection 73 electrically connects the first electrode 75 and the first lower electrode 71 through the opening 63, and the second electrical connection 83 electrically connects the second electrode 85 and the second lower electrode 81 through the opening 62. The electrical connections 73, 83 may be formed together with the electrodes 75, 85, or the electrodes 75, 85 may be formed in a separate process after the electrical connections 73, 83 are formed. While the openings 62, 63 are being formed in the non-conductive reflective film 91, the electrical connections may affect adversely on top of the lower electrodes 71, 81. This adverse effect of the electrical connections can be avoided by partially removing the upper portion of the lower electrodes 71, 81, and the electrical connections 73, 83 can come in contact with the resulting lower electrodes 71, 81 whose upper portions have been removed.

Figure 1:
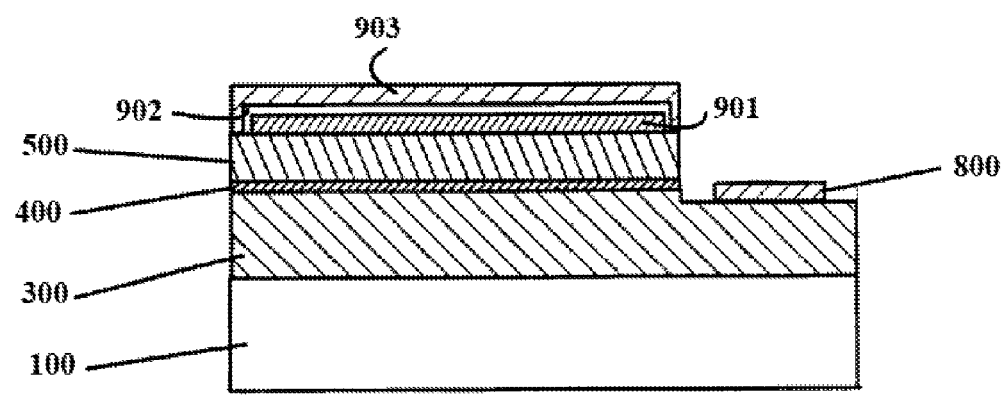
FIG. 1 shows an exemplary embodiment of the semiconductor light emitting device disclosed in U.S. Pat. No. 7,262,436.
Figure 2:
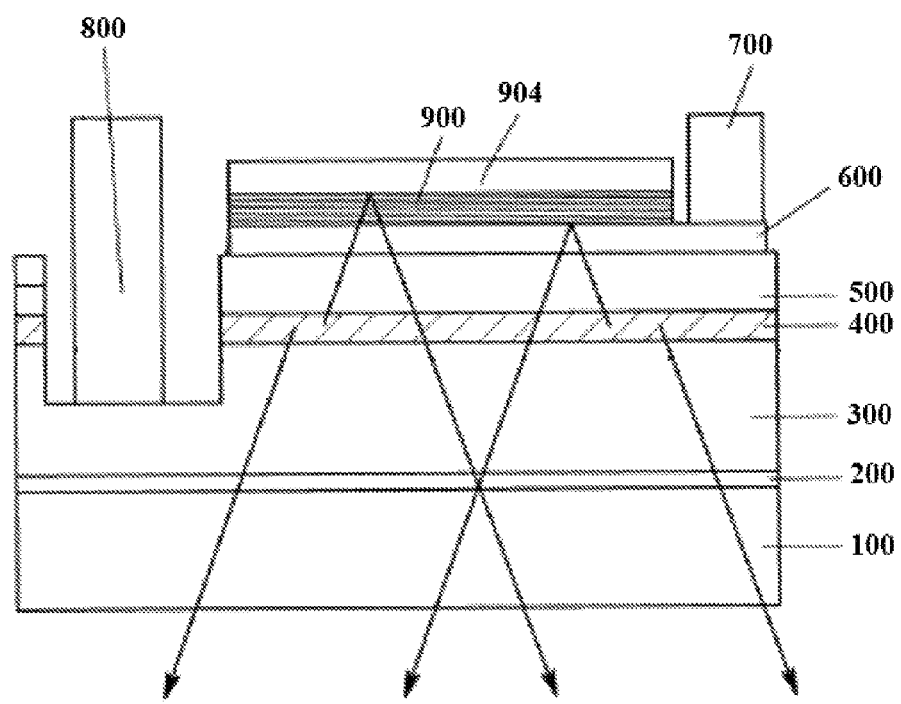
FIG. 2 shows an exemplary embodiment of the semiconductor light emitting device disclosed in JP Laid-Open Pub. No. 2006-20913.

The first electrode 75 and the second electrode 85 are those for use in electrical connection with an external electrode, which may be connected to the external electrode by eutectic bonding, soldering or wire bonding. The external electrode may be a conducting part provided at the submount, a lead frame in the package, an electrical pattern formed on the PCB, or the like, and there is no particular limit to its configuration as long as it is a wire independent of the semiconductor light emitting device. The first electrode 75 and the second electrode 85 each have a certain area and serve to reflect light that has not been reflected by the non-conductive reflective film 91. The first electrode 75 and the second electrode 85 each may use a separate bump to have a suitable height to be coupled with a package, or they themselves may be deposited to a suitable height to be coupled with a package, as illustrated in FIG. 2.

Therefore, using the non-conductive reflective film 91 rather than a metal reflective film in the semiconductor light emitting device can result in a reduced absorption loss of light. Moreover, if available, decreasing length or width of a metal structure between the non-conductive reflective film 91 and the plurality of semiconductor layers 30, 40, 50 may also result in a reduced absorption loss of light. Meanwhile, the number and distribution of the lower electrodes 71, 81 and openings 62, 63 may vary to improve current spreading.

It is understood that when the electrodes 75, 85 are positioned on the non-conductive reflective film 91 including a DBR, although light is absorbed by the electrodes 75, 85, reflectivity can be increased further by making the electrodes 75, 85 of a highly reflective metal such as Ag, Al or the like. Moreover, the size of the electrodes 75, 85 should be determined considering that the electrodes 75, 85 also serve as bonding pads and are involved in emitting heat of the semiconductor light emitting device. However, the inventors found out that if a non-conductive reflective film R including a DBR is present, light reflectivity by the non-conductive film 91 is increased as the size of the electrodes 75, 85 on the non-conductive reflective film R is decreased. This experimental result motivated the inventors to reduce the electrodes 75, 85 to a range that would not be considered in the conventional art.

Meanwhile, light is not always totally reflected by the non-conductive reflective film 91, and a portion of the light travels inside the non-conductive reflective film 91 and is incident on top of the non-conductive reflective film 91. To increase a light extraction efficiency of the semiconductor light emitting device, it is necessary to reduce the loss of the light that is incident on top of the non-conductive reflective film 91 after travelling inside the non-conductive reflective film 91. In particular, although the first electrode 75 and the second electrode 85 as metal films reflect light, they absorb a portion of the light and the light is therefore lost. Optionally, the bottom layer of the first and second electrodes 75, 85 could be made of a highly reflective metal such as Al, Ag or the like to improve the reflectivity, this leads to an absorption loss of the light caused by the metal.

On the contrary, the light incident on top of the non-conductive reflective film 91 that is not covered with the first electrode 75 and the second electrode 85 is almost totally reflected. Therefore, the light reflected from the top of the non-conductive reflective film 91 is directed towards the substrate 10 and becomes an effective emitted light.

To reduce light loss in a place covered by the electrodes 75, 85, the inventors experimentally changed the area and configuration of the electrodes 75, 85.

When the first electrode 75 and the second electrode 85 are bonded to an external electrode, they are preferably spaced from each other by 80 μm or more, so as to avoid an electrical short or to control a solder material. In addition, in order to ensure bonding strength between the electrodes and the external electrode and to ensure a necessary number of electrical connections 73, 83 are available, it is not desirable that the electrodes have a too small area or width. Larger electrodes 75, 85 are more advantageous for heat emission, and light efficiency as well as brightness are affected by the heat emission efficiency. In other words, the size of the electrodes 75, 85 (e.g., area, width, etc.) needs to be decreased to reduce light absorption under limited conditions for their functions as an electrode 75, 85 (e.g., current supply passage, bonding, heat emission, etc.). As a result of the experiment, it turned out that, when seen on the top view, the spacing between the first electrode and the second electrode is 80 μm only if a ratio of a combined area of the first and second electrodes to a planform area of the semiconductor light emitting device as seen on a top view is approximately 0.7:1 or less, and that brightness increases by approximately 6 to 7% as compared with the case where the area ratio is around 75%. More details will be provided in FIG. 7.

Figure 4:
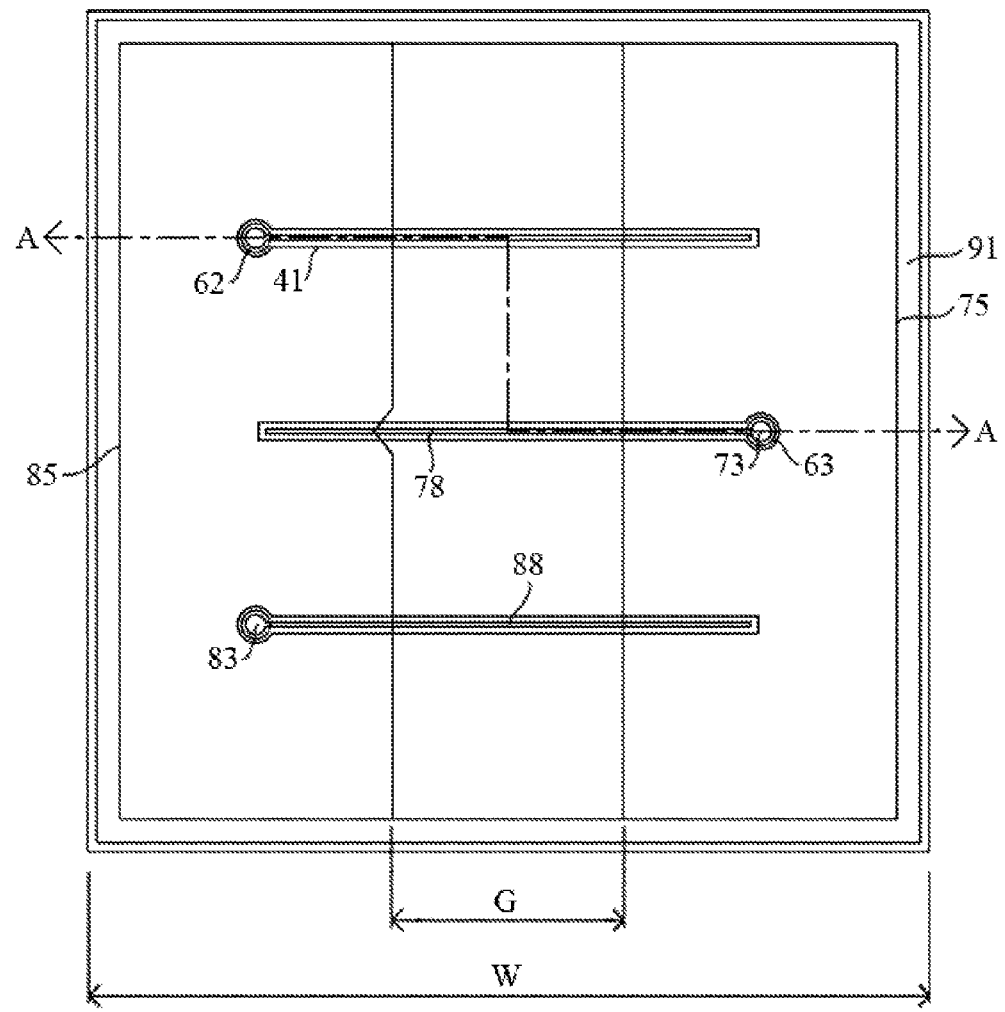
FIG. 4 shows another exemplary embodiment of a semiconductor light emitting device according to the present disclosure.
Figure 5:
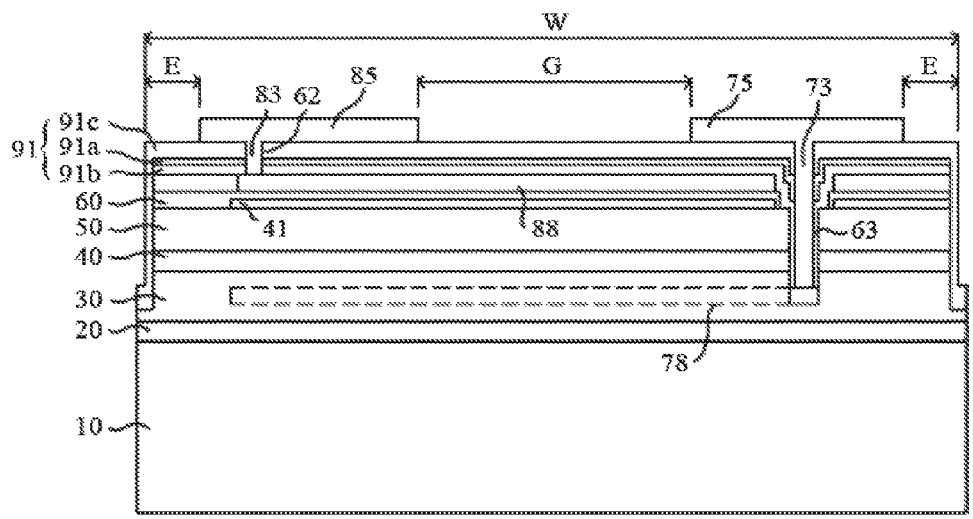
FIG. 5 shows an exemplary cross sectional view taken along line A-A of FIG. 4.

FIG. 4 shows another exemplary embodiment of a semiconductor light emitting device according to the present disclosure, and FIG. 5 shows an exemplary cross sectional view taken along line A-A of FIG. 4. In this embodiment, the semiconductor light emitting device can incorporate an extending-type lower electrode 78, 88 for improving current spreading. The first electrode 75 and the second electrode 85 can have a multilayer structure, respectively. For example, a contact layer made of Cr, Ti, Ni or an alloy thereof may be provided for a stable electrical contact with the first and second lower electrodes 71, 81, and a reflective layer, e.g., a reflective metal layer including Al or Ag may be provided on the contact layer. In another example, the electrodes 75, 85 may be composed of a contact layer (e.g., Cr, Ti, etc.)/a reflective layer (e.g., Al, Ag, etc.)/a barrier layer (e.g., Ni, etc.)/a bonding layer (e.g., Au/Sn alloy, Au/Sn/Cu alloy, Sn, thermally treated Sn, etc.).

Figure 6:
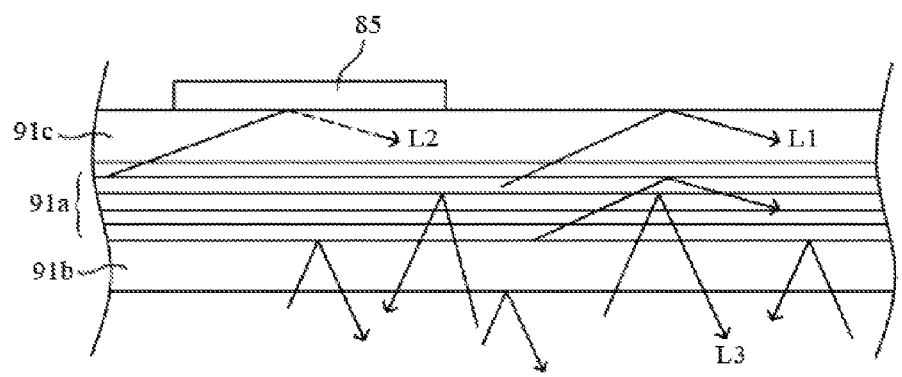
FIG. 6 shows an example of a non-conductive reflective film included in a semiconductor light emitting device according to the present disclosure.

FIG. 6 shows an example of a non-conductive reflective film included in a semiconductor light emitting device according to the present disclosure, in which the non-conductive reflective film 91 may be composed of a single dielectric layer, or have a multilayer structure. In this embodiment, the non-conductive reflective film 91 is made of a non-conductive material to reduce absorption loss of light by a metal reflective film. As one example of the multilayer structure, the non-conductive reflective film 91 may include a dielectric film 91b, a DBR (Distributed Bragg Reflector) 91a, and a clad film 91c.

In the formation of the semiconductor light emitting device of this embodiment, a height difference is created due to a structure like the lower electrode 71, 81. As the deposition of the DBR 91a needs to be done with high precision, the dielectric film 91b having a uniform thickness may be formed before the deposition such that the DBR 91a can be prepared in a stable manner, and light reflection can also benefit therefrom.

Preferably, the dielectric film 91b is made of a suitable material like $SiO_2$, and has a thickness of 0.2 to 1.0 μm. If the dielectric film 91b is too thin, it may not be able to sufficiently cover the lower electrodes 71, 81 which have a height of 2 to 3 μm; while if the dielectric film 91b is too thick, it may make it difficult to form openings 62, 63 in the non-conductive reflective film 91. The dielectric film 91b may have a thickness greater than the DBR 91a that follows. In addition, the dielectric film 91b needs to be formed with a suitable method for ensuring the reliability of the device. For example, the dielectric film 91b made of $SiO_2$ is preferably formed by CVD (Chemical Vapor Deposition), and more particularly by PECVD (Plasma Enhanced CVD). This is because CVD is more advantageous than PVD (Physical Vapor Deposition) such as E-Beam evaporation, in terms of achieving improved step coverage. More specifically, if the dielectric film 91b is formed by E-Beam evaporation, it is difficult to form the dielectric film 91b in the intended thickness in a region having the height difference, the reflectivity of the DBR 91a may be lowered, and the electrical insulation may be deteriorated. As such, the dielectric film 91b is preferably formed by CVD for reducing the height difference and ensuring the insulation effect. In this way, it is possible to ensure the reliability of the resulting semiconductor light emitting device and to ensure the functions of the dielectric film as a reflective film.

The DBR 91a is formed on the dielectric film 91b. For example, the DBR 91a is composed of a stack of alternating $SiO_2$ and $TiO_2$ pairs. In addition, the DBR 91a can be composed of a combination of a higher refractive index material such as $Ta_2O_5$, HfO, ZrO, SiN or the like and a lower refractive index dielectric thin film (typically, $SiO_2$). For example, the DBR 95a may be composed of a stack of alternating $SiO_2/TiO_2$, $SiO_2/Ta_2O_2$, or $SiO_2/HfO$ pairs, as $SiO_2/TiO_2$ demonstrates a high blue-light reflection efficiency, and $SiO_2/Ta_2O_2$ or $SiO_2/HfO$ demonstrates a high UV-ray reflection efficiency. If the DBR 91a is composed of $SiO_2/TiO_2$, it should preferably undergo an optimization process in consideration of an angle of incidence as well as wavelength-dependent reflectivity, using a ¼ optical thickness of the wavelength of the light emitted from the active layer 40 as a reference, yet it is not absolutely required that each layer should have a ¼ optical thickness of the wavelength. The number of combinations in the stack is suitably between 4 and 40 pairs. If the DBR 91a is composed of a stack of alternating $SiO_2/TiO_2$, the DBR 91a is preferably formed by PVD (Physical Vapor Deposition), and more particularly, E-Beam evaporation, sputtering or thermal evaporation.

The clad film 91c may be made of a metal oxide such as $Al_2O_3$, a dielectric film 91b such as $SiO_2$ or SiON, or other material such as MaF or CaF. Preferably, the clad film 91c has a thickness ranging from λ/4n to 3.0 μm, in which A denotes a wavelength of the light generated from the active layer 40, and n denotes a refractive index of a material composing the clad film 91c. If λ is 450 nm (4500 Å), the clad film 91c can be formed in a thickness of 771 Å (4500/4×1.46=771 Å) or more.

In the DBR 91a composed of multiple pairs of $SiO_2/TiO_2$, while the top layer of the DBR 91a can be $TiO_2$, it may optionally made of a $SiO_2$ layer having a thickness of λ/4n. In this regard, it is desirable that the clad film 91c is thicker than λ/4n to be distinguished from the top layer of the DBR 91a that is placed below the clad film 91c. However, it is not desirable that the clad film 91c is too thick, e.g., 3.0 μm or more, because it imposes a burden on the subsequent perforation process and only increases the material cost without contributing to the improvement of the efficiency. Therefore, a maximum value of the thickness of the clad film 91c falls within the range of 1 to 3 μm, not to impose any burden on the subsequent processes. Nevertheless, it is not impossible, depending on the case, to make the top layer as thick as 3.0 μm or more.

The DBR 91a preferably has a higher effective refractive index than the refractive index of the dielectric film 91b for light reflection and guidance. If the DBR 91a and the electrode 75, 85 come in direct contact with each other, a portion of the light travelling through the DBR 91a may be absorbed by the electrode 75, 85. Hence, this light absorption by the electrode 75, 85 can be substantially reduced by incorporating the clad film 91c having a lower refractive index than the DBR 91a. With these refractive indices thus selected, the dielectric film 91b-DBR 91a-clad film 91c can be explained in view of an optical waveguide. The optical waveguide is a structure that encloses a propagation part of light by a material having a lower refractive index than the propagation part of light and directs the light by total reflection. In this regard, if the DBR 91a can be taken as the propagation part, the dielectric film 91b and the clad film 91c can be taken as part of the structure that enclose the propagation part.

For example, if the DBR 91a is made of a light transmitting material (e.g., $SiO_2/TiO_2$) to prevent light absorption, the dielectric film 91b may be made of a dielectric material (e.g., $SiO_2$) having a lower effective refractive index than the DBR 91a. Here, the effective refractive index means an equivalent refractive index of light that can travel in a waveguide made of materials having different refractive indices. The clad film 91c may also be made of a material having a lower effective refractive index than the DBR 91a (e.g., $Al_2O_3$, $SiO_2$, SiON, MgF, CaF). If the DBR 91a is composed of $SiO_2/TiO_2$, with $SiO_2$ having a refractive index of 1.46 and $TiO_2$ having a refractive index of 2.4, an effective refractive index of the DBR 91a has a value between 1.46 and 2.4. Accordingly, the dielectric film 91b can be composed of $SiO_2$, and a suitable thickness for it would be between 0.2 and 1.0 μm. Further, the clad film 91c may also be composed of $SiO_2$ having a refractive index of 1.46 which is lower than the effective refractive index of the DBR 91a.

Although not desirable from the perspective of the optical waveguide, if the overall technical ideas of this disclosure would be taken into consideration, it is an option to omit the dielectric film 91b from the perspective of the technical ideas of the present disclosure, yet there is no reason to exclude the configuration composed of the DBR 91a and the clad film 91c. Alternatively, a $TiO_2$ dielectric film 91b may be used in place of the DBR 91a. Further, as an alternative, the clad film 91c may be omitted if the DBR 91a includes a $SiO_2$ layer on its top. Moreover, if the dielectric film 91b and the DBR 91a are designed in consideration of the reflectivity of light that travels substantially in the horizontal direction, again, the clad film 91c may be omitted even when the DBR 91a has a $TiO_2$ layer as its top layer.

In short, the dielectric film 91b, the DBR 91a and the clad film 91c which constitute the non-conductive reflective film 91 serve as an optical waveguide, and their combined thickness is preferably 1 to 8 μm.

As illustrate in FIG. 6, the DBR 91a having a higher reflectivity for light L3 entering nearly in the normal direction reflects approximately 99% or more of the light. However, lights L1, L2 that are incident at an angle pass through the DBR 91a, and then incident on top of the clad film 91c or the non-conductive reflective film 91. In those parts not covered with the electrodes 75, 85, the light L1 is almost totally reflected from; while the light L2 incident on the electrodes 75, 85 is partially absorbed.

Figure 7:
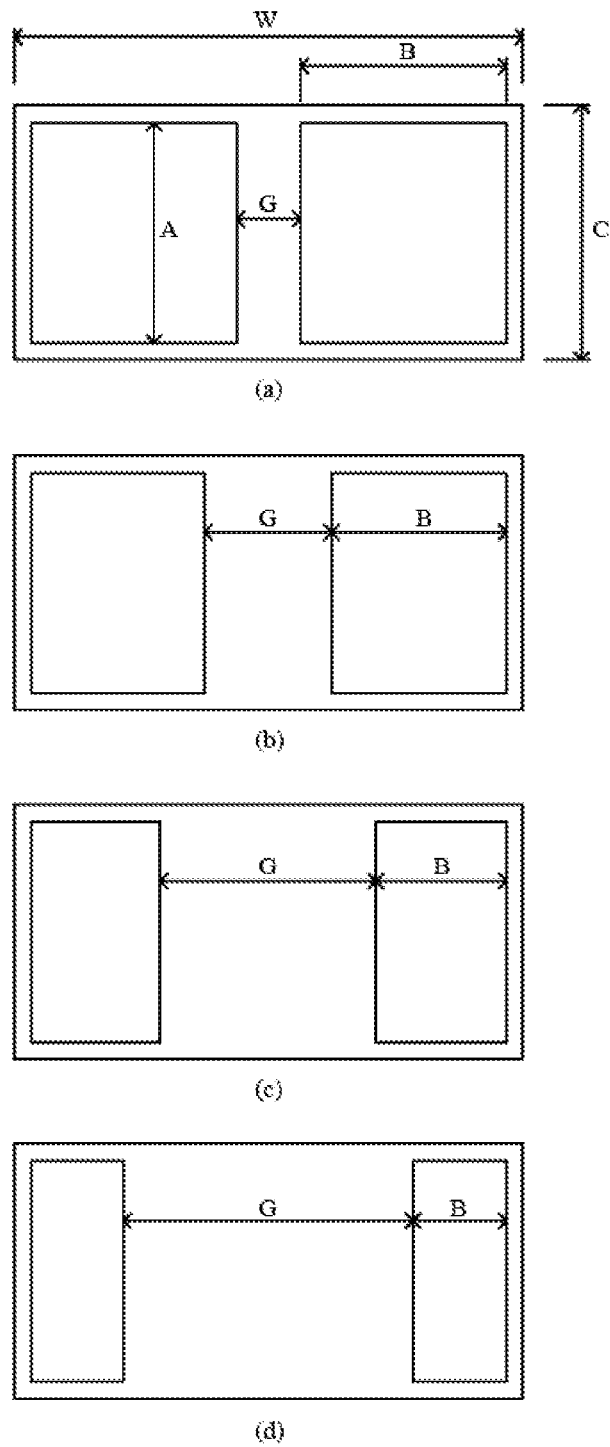
FIG. 7 shows examples of different area ratios and spacings between electrodes.

FIG. 7 shows examples of different area ratios and spacing between electrodes. Here, a spacing G was set to 150 μm (FIG. 7a), 300 μm (FIG. 7b), 450 μm (FIG. 7c) and 600 μm (FIG. 7d), a gap between the periphery of the light emitting device and the edge of the electrode was kept constant. A distance W between edges of the light emitting devices with the electrodes being oppositely arranged was set to 1200 μm, a vertical length C was set to 600 μm, a horizontal length B of the electrode was set to 485 μm, 410 μm, 335 μm, 260 μm, respectively, and a vertical length A of the electrode was kept constant, i.e. 520 μm. A ratio of an area of the electrode to a planform area of the light emitting device comes to 0.7:1, 0.59:1, 0.48:1, and 0.38:1, respectively. As a reference example, suppose that a spacing between the electrodes is 80 μm. Then the area ratio would be 0.75:1. The inventors also found out that if the area of the electrode stayed the same, brightness did not change much even with a varying electrode spacing.

Figure 8:
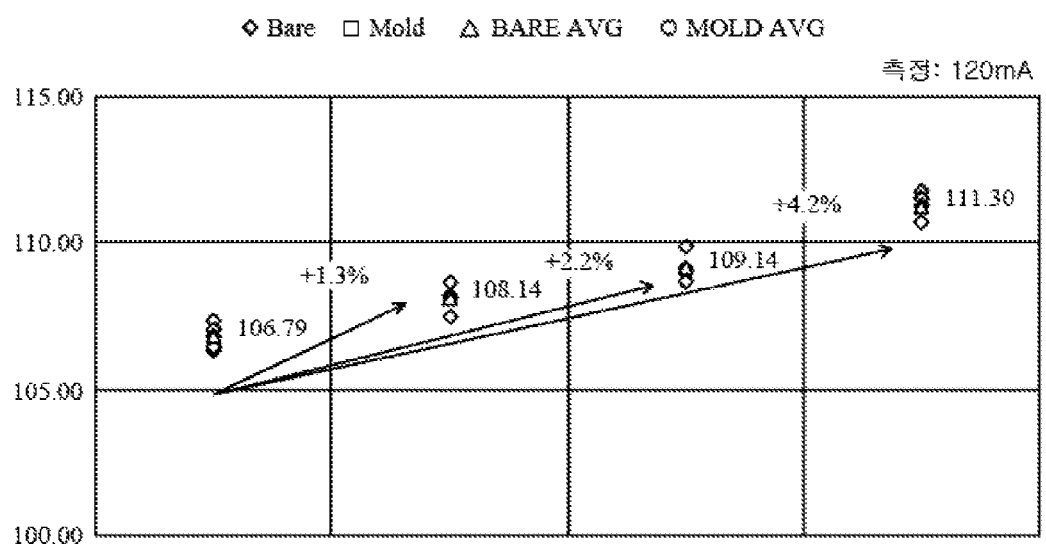
FIG. 8 is a graph showing the results of experiments described in FIG. 7.

FIG. 8 is a graph showing results of the experiments described in FIG. 7. Having a reference brightness being 100, resulting brightness values were 106.79 (FIG. 7a), 108.14 (FIG. 7b), 109.14 (FIG. 7c), and 111.30 (FIG. 7d), respectively. It was confirmed that brightness has been substantially increased. Brightness will be increased even more by reducing the area ratio of the electrode below 0.38.

Figure 9:
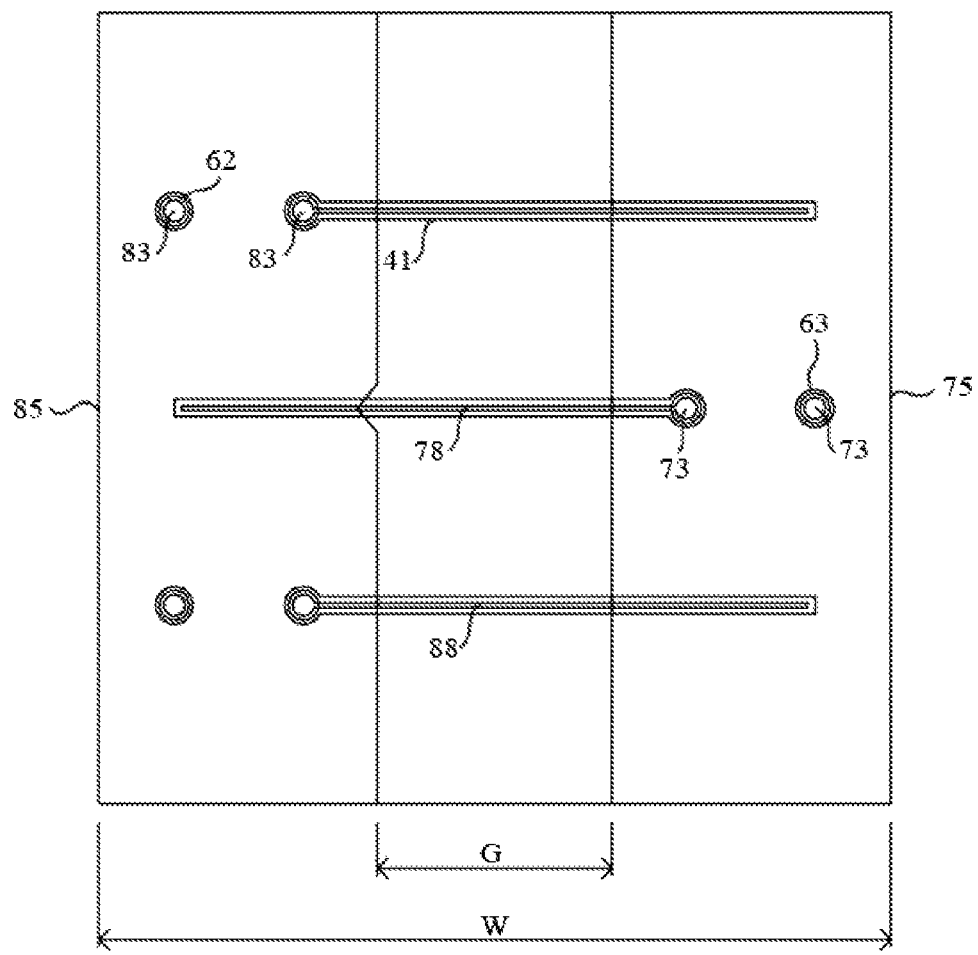
FIG. 9 shows another exemplary embodiment of a semiconductor light emitting device according to the present disclosure.

FIG. 9 shows another exemplary embodiment of a semiconductor light emitting device according to the present disclosure. Here, although the non-conductive reflective film 91 serves its function, a contact face created when the non-conductive reflective film 91 comes into contact with the first and second electrodes 75, 85 can reflect a portion of light, while the first and second electrodes 75, 85 can absorb another portion of light. Therefore, in terms of improving brightness, the first and second electrodes 75, 85 should preferably have a smaller area. On the contrary, in terms of thermal conductivity for emitting heat, the first and second electrodes 75, 85 should preferably have a larger area. Accordingly, in terms of heat emission, there is a limit as to how large a spacing G between an edge 77 of the first electrode 75 and an edge 87 of the second electrode 85 can be.

This embodiment has a structure advantageous for ensuring a heat emission area as the first electrode 75 and the second electrode 85 reach the top edge of the non-conductive reflective film 91. In terms of improving brightness, therefore, the heat emission area would not be decreased much even if the spacing G between the first electrode 75 and the second electrode 85 is sufficiently large. This makes it possible to have the spacing G large enough for electrical insulation while bonding the first and second electrodes 75, 85 of the semiconductor light emitting device with an external electrode.

In order to manufacture these semiconductor light emitting devices, for example, in the wafer state, a metal layer for forming the first electrode 75 and the second electrode 85 can be deposited in a band shape, multiple rows, or a stripe pattern. After that, a separation process for obtaining individual devices is carried out. For example, the wafer is cut along the division lines using a process such as breaking, sawing or scribing-and-breaking. A chemical etching process may optionally be included. In particular, in the scribing-and-breaking process, the scribing process uses a cutter or a laser which can be focused onto the substrate 10, including the surface and inside of the substrate 10, of the semiconductor light emitting device. In this scribing process using a laser, preliminarily cut semiconductor light emitting devices may be obtained by cutting adjacent semiconductor light emitting devices along the division lines. In the breaking process following the scribing process, those preliminarily cut semiconductor light emitting devices can then become completely separated individual semiconductor light emitting devices. Through this division process, the lateral face of the substrate 10, the lateral faces of the plurality of semiconductor layers 30, 40, 50, the lateral face of the non-conductive reflective film 91, and the lateral faces of the first and second electrodes 75, 85 become cutting faces.

Figure 10:
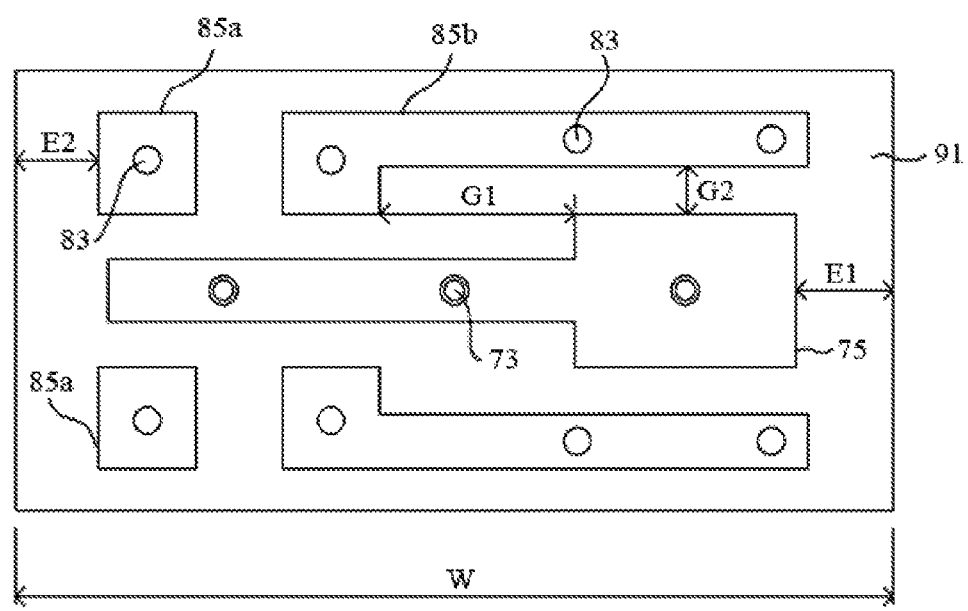
FIG. 10 shows yet another exemplary embodiment of a semiconductor light emitting device according to the present disclosure.

FIG. 10 shows yet another exemplary embodiment of a semiconductor light emitting device according to the present disclosure, in which the extending-type lower electrode has been removed, and an island-type lower electrode (not shown) is provided to electrically connect electrical connections 73, 83 with the first semiconductor layer and the light transmitting conductive film. The second electrode is divided into a plurality of second sub-electrodes 85a, 85b, and the first electrode 75 is stretched out between the plurality of second sub-electrodes 85a, 85b. Each sub-electrode 85a, 85b is formed in correspondence with the electrical connection 83. Reducing the absorption loss of light is possible by dividing an electrode into a plurality of sub-electrodes, and reducing the area of each electrode. In this regard, if a spacing G1, G2 between the first electrode 75 and the second sub-electrode 85a, 85b, and a gap E1, E2 with the edge are regulated, a ratio of the spacing G and the gap E to the distance W will be changed, and consequently, a ratio of an area of the electrode to an planform area of the device will be changed. Through these efforts, it was discovered that brightness becomes relatively higher when the area ratio is approximately 0.7:1 or less.

Figure 11:
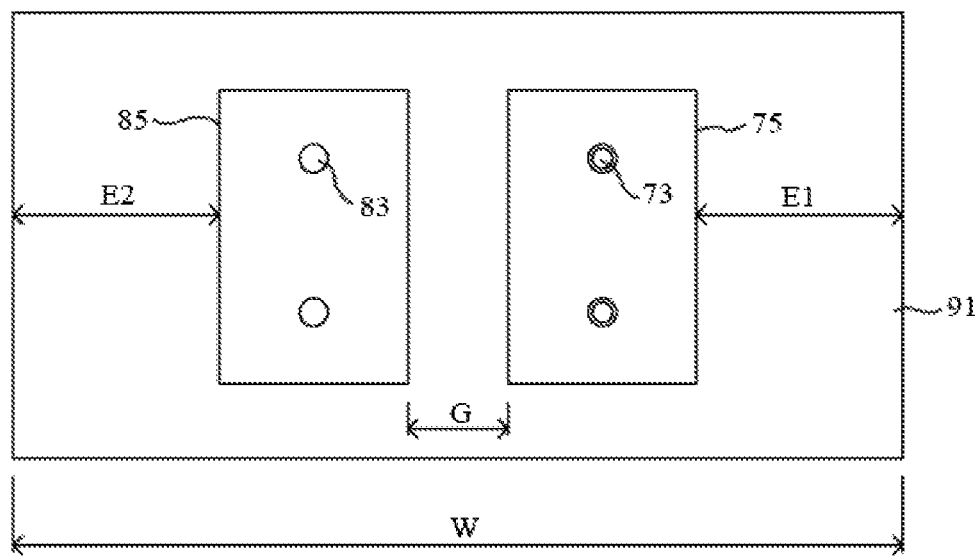
FIG. 11 shows yet another exemplary embodiment of a semiconductor light emitting device according to the present disclosure.

FIG. 11 shows yet another exemplary embodiment of a semiconductor light emitting device according to the present disclosure, in which the gap E1, E2 between each edge of respective semiconductor layers and the first and second electrodes 75, 85 is larger than the gap G between the first electrode 75 and the second electrode 85. To reduce light absorption by the electrodes, it may be another option to increase the gap E1, E2 between the edge of the respective semiconductor light emitting layers and the electrode, rather than increasing the spacing G between the first electrode 75 and the second electrode 85. Here, the term 'gap' embraces a gap in the direction that the first and second electrodes are oppositely arranged, as well as a gap in the direction normal thereto.

Figure 12:
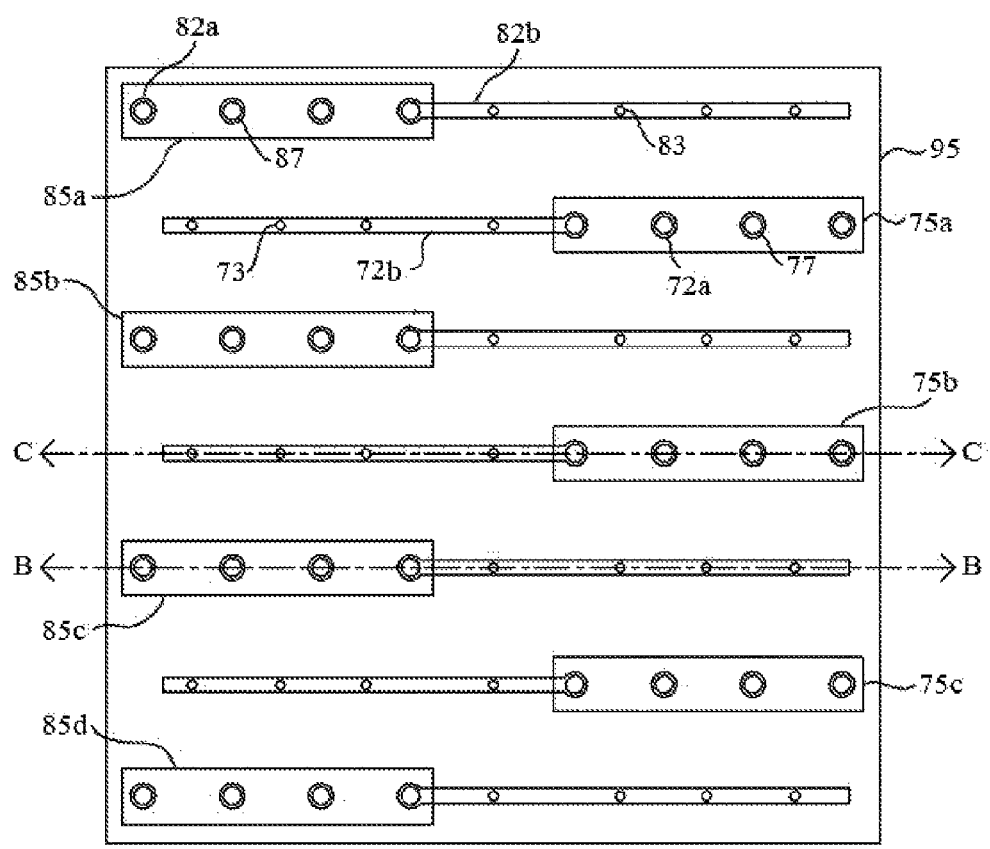
FIG. 12 shows yet another exemplary embodiment of a semiconductor light emitting device according to the present disclosure.
Figure 13:
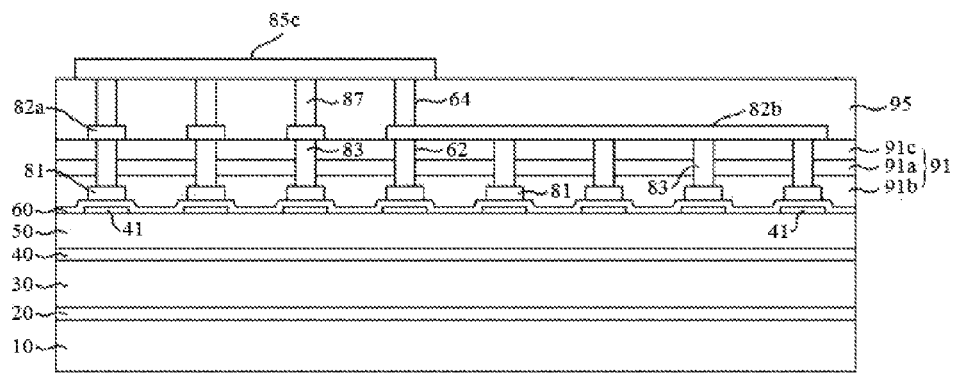
FIG. 13 shows an exemplary cross sectional view taken along line B-B of FIG. 12.
Figure 14:
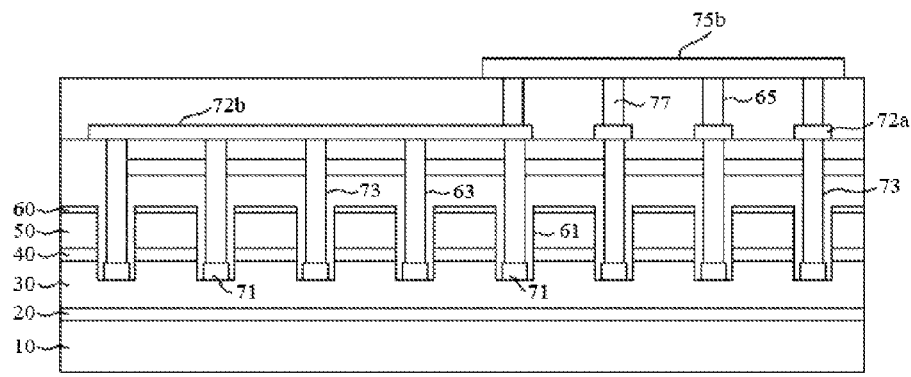
FIG. 14 shows an exemplary cross sectional view taken along line C-C FIG. 12.

FIG. 12 shows yet another exemplary embodiment of a semiconductor light emitting device according to the present disclosure, FIG. 13 shows an exemplary cross sectional view taken along line B-B of FIG. 12, and FIG. 14 shows an exemplary cross sectional view taken along line C-C FIG. 12.

The semiconductor light emitting device has, on its non-conductive reflective film, island-type connecting electrodes 72a, 82a, and extending-type connecting electrodes 72b, 82b. A plurality of upper side electrical connections 77, 87 pass through an insulating film 95b and electrically connect the first electrodes 75a, 75b, 75c and the second electrodes 85a, 85b, 85c, 85d, with the island-type connecting electrodes 72a, 82a and the extending-type connecting electrodes 72b, 82b, respectively. A plurality of lower electrical connections 73, 83 pass through the non-conductive reflective film 91 and electrically connect the island-type connecting electrodes 72a, 82a and the extending-type connecting electrodes 72b, 82b with the plurality of semiconductor layers, respectively. Here, the term 'island-type' generally indicates any polygonal shape that is not extended or elongated in one direction, such as, a circle, a triangle, a square or the like.

The insulating film 95 is formed on the non-conductive reflective film 91 in a way that it covers the connecting electrodes 72a, 72b, 82a, 82b, and may be composed of a single layer (e.g., SiO$_2$) or multilayers. Since the first electrodes 75a, 75b, 75c and the second electrodes 85a, 85b, 85c, 85d are all formed on the insulating film 95, the connecting electrodes 72a, 72b, 82a, 82b can be shaped or distributed on the non-conductive reflective film 91 with a greater degree of design freedom.

The first electrode part formed on the insulating film 95 includes a plurality of sub-electrodes 75a, 75b, 75c which are spaced apart from each other, and an upper electrode 85 (second electrode) of the second electrode part includes a plurality of sub-electrodes 85a, 85b, 85c, 85d which are spaced apart from each other. Each of the first sub-electrodes 75a, 75b, 75c serves to connect the end of the first extending-type connecting electrode 72b to a plurality of the first island-type connecting electrodes 72a positioned in extension of the first extending-type connecting electrode 72b. Each of the second sub-electrodes 85a, 85b, 85c, 85d serves to connect the end of the second extending-type connecting electrode 82b to a plurality of second island-type connecting electrodes 82b positioned in extension of the second extending-type connecting electrode 82b.

Therefore, unlike the exemplary embodiment illustrated in FIG. 3, according to this embodiment, the first electrode and the second electrode each include a plurality of sub-electrodes 75a, 75b, 75c, 85a, 85b, 85c, 85d, so as to stop an unnecessary increase in the electrode area. Preferably, a ratio of a combined area of the sub-electrodes 75a, 75b, 75c, 85a, 85b, 85c, 85d to a planform area of the semiconductor light emitting device is 0.7:1 or less.

The first electrode and the second electrode are those bonded to outside by eutectic bonding or soldering for example. In case of soldering, a solder is dispensed or printed onto each the sub-electrode 75a, 75b, 75c, 85a, 85b, 85c, 85d in a way that the solder is kept from spreading outside each sub-electrode 75a, 75b, 75c, 85a, 85b, 85c, 85d.

In a process of fixing or bonding the first electrode 75 and the second electrode 85 to an external electrode, the semiconductor light emitting device may be cracked under thermal shock or the like. To prevent this cracking, the first electrode 75 and the second electrode 85 may be designed in a layered structure (e.g., see FIG. 15). Whether or not the first and the second electrodes have such a layered structure for preventing cracking, as in the exemplary embodiment illustrated in FIG. 12, the first and second electrodes each may have a plurality of sub-electrodes, with the sub-electrodes being spaced apart from each other. As compared with the first electrode 75 and the second electrode 85 present as a single layer as in the exemplary embodiment illustrated in FIG. 3, each sub-electrode in this embodiment has a small area such that the plurality of semiconductors can be less affected by thermal stress. This fact can be advantageous for preventing cracking caused by thermal shock during the bonding process.

Figure 15:
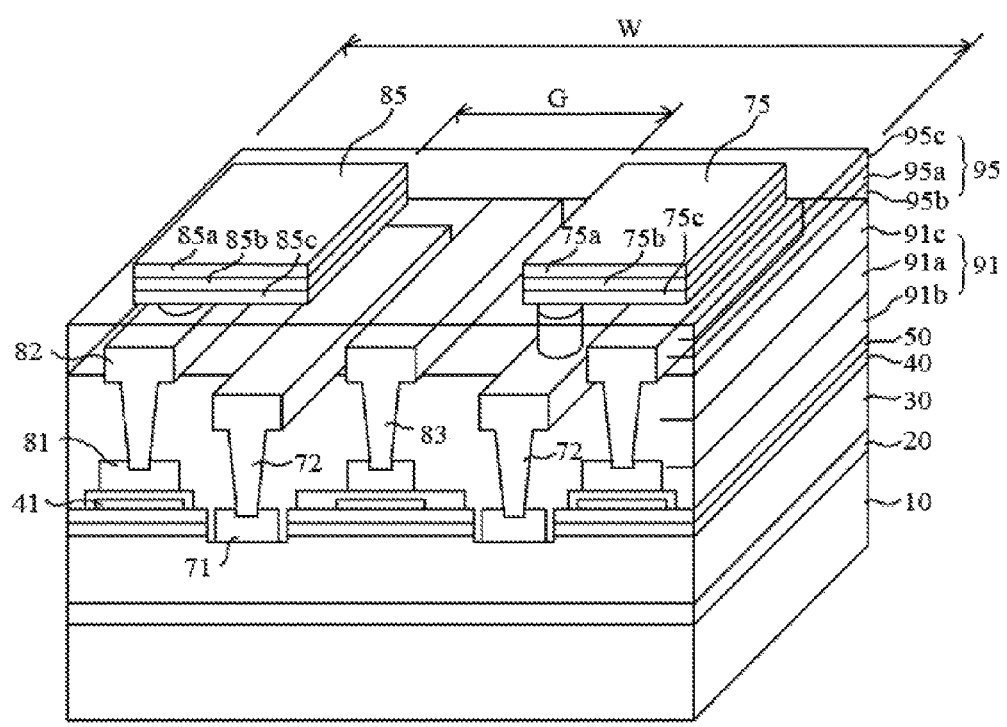
FIG. 15 shows yet another exemplary embodiment of a semiconductor light emitting device according to the present disclosure.

FIG. 15 shows yet another exemplary embodiment of a semiconductor light emitting device according to the present disclosure, in which the insulating film 91 can serve as an additional reflective film. For example, the non-conductive reflective film 91 may have the same configuration as the non-conductive reflective film 91 described in FIG. 5 and FIG. 6, and the additional reflective film 95 mentioned above can have a similar structure to the non-conductive reflective film 91, i.e. a light guide structure including a lower dielectric film 95b, a second DBR 95a and an upper dielectric film 95c, thereby contributing to reducing light absorption by the first and second electrodes 75, 85 formed on the additional reflective film. In order to increase reflectivity of light towards to the plurality of semiconductor layers, while reducing light absorption in absence of a metal reflective film, at least one of the non-conductive reflective film 91 and the additional reflective film 95 preferably has a DBR. If the non-conductive reflective film 91 and the additional reflective film 95 each have a DBR, a second DBR 95a included in the insulating film 95 may have a wavelength optimized for reflection, and a first DBR 91a included in the non-conductive reflective film 91 may also have a wavelength optimized for reflection, yet the wavelength of the former is longer than the wavelength of the latter.

Even though a portion of light may be absorbed by the first electrode 75 and the second electrode 85 through the additional reflective film 95, light loss can still be reduced and brightness can be improved by regulating spacing and distance ratios between the first electrode 75 and the second electrode 85 or a ratio of an area of the first and second electrodes 75, 85 to a planform area of the device.

The first electrode 75 and the second electrode 85 are electrically connected to an electrode available outside (package, COB, sub-mount, etc.) by techniques including stud bump bonding, conductive paste application, eutectic bonding, soldering, wire bonding or the like. In this embodiment, the first electrode 75 and the second electrode 85 are configured for bonding and for increasing the reflectivity.

For example, in case of eutectic bonding, top layers 75a, 85a of the first and second electrodes 75, 85 may be formed of an Au/Sn alloy or an Au/Sn/Cu alloy.

In another exemplary embodiment, the first electrode 75 and the second electrode 85 may be electrically connected to the outside by soldering. In this case, the first electrode 75 and the second electrode 85 may have a reflective layer 75c, 85c/a barrier layer 75b, 85b/a soldering layer 75a, 85a, respectively, which are stacked in order. For example, the reflective layer 75c, 85c is composed of Ag, Al or the like, and a contact layer (e.g., Ti, Cr or the like) may be arranged below the reflective layer 75c, 85c. The barrier layer 75b, 85b is composed of at least one selected from Ni, Ti, Cr, W and TiW, and serves to prevent invasion of a solder material into the plurality of semiconductor layers. The soldering layer 75a, 85a may be composed of Au, or Sn (soldering layer)/Au (anti-oxidation layer), or Sn only without Au, or a thermally treated Sn. As for the solder, a lead-free solder may be employed.

In a process of fixing or bonding the first electrode 75 and the second electrode 85 to the external electrode, the semiconductor light emitting device may be cracked under thermal shock or the like. In yet another exemplary embodiment of the layered structure for the first electrode 75 and the second electrode 85, the first electrode 75 and the second electrode 85 have a first layer 75c, 85c and a second layer 75b, 85b, respectively. When the semiconductor light emitting device is fixed to the external electrode, the first layer 75c, 85c can be available as a stress relief layer or an anti-cracking layer for preventing the creation of a crack, while the second layer 75b, 85b can be available as an anti-burst layer for keeping the first layer 75c, 85c from bursting. In addition, the first layer 75c, 85c can be made of Al or Ag and serve as a reflective layer for reflecting the light having passed through the additional reflective film 95. Further, the second layer 75b, 85b can be made of a material such as Ti, Ni, Cr, W, TiW or the like and serve as a barrier layer for inhibiting invasion of a solder material used for bonding (e.g., soldering) towards the semiconductor light emitting device. Alternatively, the first layer 75c, 85c and the second layer 75b, 85b may having different combinations of these functions. Preferably, a contact layer (not shown) made of a metal like Cr, Ti, N or the like may further be arranged below the first layer 75c, 85c, so as to increase bonding strength thereof with the additional reflective film 95. Preferably and generally, the first electrode 75 and the second electrode 85 have the top layers 75a, 85a, respectively. This top layers 75a, 85a are usually composed of a metal having excellent electrical conductivity and highly resistance to oxidation. For instance, it may be composed of Au, Sn, AuSn, Ag, Pt and an alloy thereof, or a combination thereof (e.g., Au/Sn, Au/AuSn, Sn, thermally treated Sn). If this condition is satisfied, there are no other limitations.

While openings 62, 63 are being formed in the non-conductive reflective film 91, the electrical connections may affect adversely on top of the lower electrodes 71, 81. This adverse effect of the electrical connections can be avoided by partially removing the upper portion of the lower electrodes 71, 81, and the electrical connections 73, 83 can come in contact with the resulting lower electrodes 71, 81 whose upper portions have been removed. This will be described later in FIG. 17.

Figure 16:
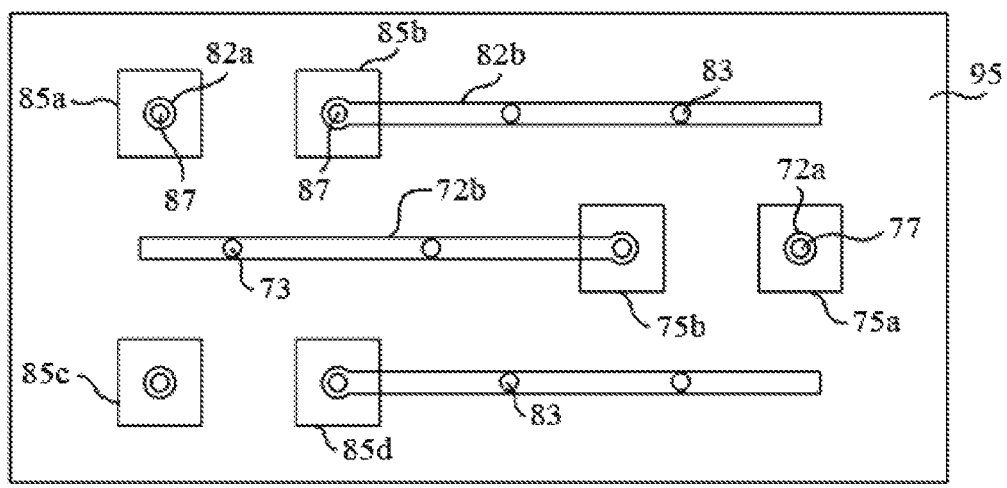
FIG. 16 shows yet another exemplary embodiment of a semiconductor light emitting device according to the present disclosure.

FIG. 16 shows yet another exemplary embodiment of a semiconductor light emitting device according to the present disclosure, in which the semiconductor light emitting device is smaller in size or has a rectangular shape on its top view. Alternatively, sub-electrodes 75a, 85a, 85c connected to island-type connecting electrodes 72a, 82a, and sub-electrodes 75b, 85b, 85d connected to extending-type electrodes 72b, 82b may be arranged on the insulating film 95, keeping a distance from each other. These sub-electrodes may be electrically connected to an external electrode, respectively.

Figure 17:
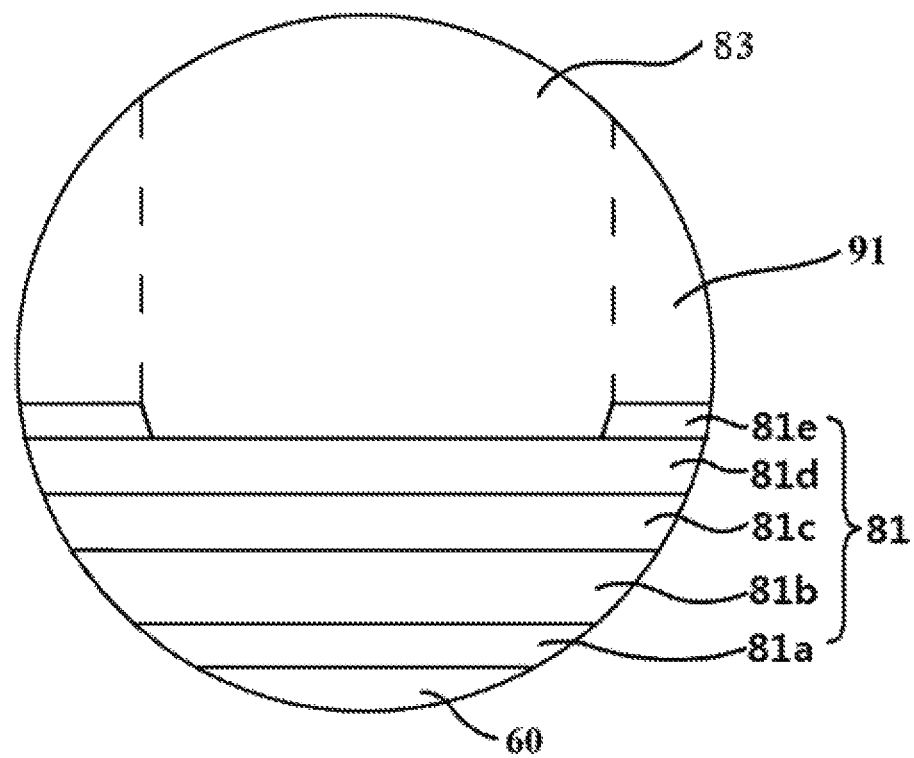
FIG. 17 shows an example of a contact between a lower electrode and an electrical connection in a semiconductor light emitting device according to the present disclosure.

FIG. 17 shows an example of a contact between a lower electrode and an electrical connection in a semiconductor light emitting device according to the present disclosure, and in particular, an example of a layered structure of the second lower electrode 81. In this example, even though it would be required to design a ratio of the spacing between the first electrode and the second electrode to a distance between the edges on both sides in the plurality of semiconductor layers, or a ratio of an area of the first and second electrodes to a planform area of the device in view of improving brightness, it is desirable to facilitate the supply of current and to impede an increase in the operating voltage. Therefore, as the number of electrical connections may be limited in a defined or limited area of the first electrode and the second electrode, each electrical connection preferably has a structure to have a reduced resistance therein.

In this embodiment, the second lower electrode 81 includes a contact layer 81a, a reflective layer 81b, a barrier layer 81c, an anti-oxidation layer 81d and an anti-etching layer 81e (protecting layer), which are formed on the light transmitting conductive film 60 in order. The first lower electrode 71 also has a similar structure. The contact layer 81a is preferably made of a material making an excellent electrical contact with the light transmitting conductive film 60 (e.g., ITO). The contact layer 81a is mainly obtained using a material such as Cr or Ti, but Ni, TiW or any metal having an excellent reflectivity (e.g., Al, Ag or the like) may also be used. The reflective layer 81b can be made of a highly reflective metal (e.g., Ag, Al or a combination thereof). The reflective layer 81b reflects light generated from the active layer 40 towards the plurality of semiconductor layers 30, 40, 50. The reflective layer 81b may be omitted. The barrier layer 81c prevents the material of the reflective layer 81b or the material of the anti-oxidation layer 81b from spreading into other layers. The barrier layer 81c can be made of at least one selected from Ti, Ni, Cr, W, TiW, and the like, and Al or Ag can also be used if high reflectivity is required. The anti-oxidation layer 81d can be made of Au, Pt, or any material that is resistant to oxidation when exposed to outside and comes into contact with oxygen. The anti-oxidation layer 81d is usually made of Au having a superior electrical conductivity. The anti-etching layer 81e is a layer exposed to a dry etching process for forming the opening 61. During the dry etching process, the anti-etching layer 81e protects the second lower electrode 81, and in particular, it serves to prevent damage on the anti-oxidation layer 81d. If the anti-etching layer 81e is made of Au, its bonding strength with the non-conductive reflective film 91 will be weakened, and part of Au will be damaged or ruined during the etching process. As such, the anti-etching layer 81e is made of a material such as Ni, W, TiW, Cr, Pd, Mo or the like, rather than using Au, such that its bonding strength with the non-conductive reflective film 91 can be maintained and reliability can be enhanced.

In the dry etching process, an F group-containing halogen gas (e.g., $CF_4$, $C_2F_6$, $C_3F_8$, $SF_6$) can be used for etching gas. During the dry etching process, a material such as an insulating substance or impurities can be produced on the top layer portion of the second lower electrode 81. For example, the F group-containing halogen gas is reacted with a metal in the top layer of the electrode to produce a certain material. For instance, at least a part of the material including Ni, W, TiW, Cr, Pd, Mo or the like used for the anti-etching barrier 81e is reacted with the etching gas in the dry etching process to produce a material (e.g., NiF). Once the opening 62 is formed, the anti-etching barrier 81e corresponding to the opening 62 is removed by a wet etching process that follows. Such a material is removed together and comes into contact with a portion of the anti-oxidation layer 81d having the exposed electrical connection 83, thereby preventing an increased in the operating voltage due to the material.

Although a smaller ratio of a combined area of the lower electrodes 71, 81 to a planform area of the device as seen on a top view is more advantageous in view of reducing light absorption, this smaller combined area of the lower electrodes 71, 81 or the smaller ratio tends to increase the operating voltage. Meanwhile, when constant current is supplied, the efficiency of light emission gets higher and the brightness can be improved accordingly. As in this embodiment, the device having a structure for stopping any increase in the operating voltage by removing the anti-etching layer 81e of the lower electrode 71, 81 that corresponds to the opening 62, 63 is favored over a device without having such structure in terms of reducing the light absorption, impeding an increase in the operating voltage and improving the brightness. For example, suppose that the semiconductor light emitting device of this embodiment has the same planform area as the semiconductor light emitting device of the comparison embodiment. The operating voltage in this embodiment where the combined area of the lower electrodes is smaller than the comparison embodiment can still be not higher than that of the comparison embodiment by incorporating the structure for impeding an increase in the operating voltage. Therefore, reducing light absorption can result in higher brightness, without necessary increasing the operating voltage. In another view, the operating voltage of this embodiment may be lower if both this embodiment and the comparison embodiment have the same combined area of the lower electrodes.

A semiconductor light emitting device according to the present disclosure has improved brightness by having at least 80 µm of the spacing between the electrodes and a reduced area of the electrodes.

Another semiconductor light emitting device according to the present disclosure has improved brightness by choosing an optimized or desirable ratio of an area of the electrodes to a planform area of the semiconductor light emitting device.

Yet another semiconductor light emitting device according to the present disclosure has improved brightness by using the non-conductive reflective film, rather than using a metal reflective film, thereby reducing the absorption loss of light.

Yet another semiconductor light emitting device according to the present disclosure prevents degradation of the device caused by a non-uniform distribution of current, by facilitating current spreading to the plurality of semiconductor layers by means of the connecting electrodes—the lower electrodes structure through multiple opening that are evenly formed in the non-conductive reflective film.

Yet another semiconductor light emitting device according to the present disclosure does not require an elongated metal band such as a finger electrode, or needs a smaller number of those elongated metal bands on the first semiconductor layer and/or the second semiconductor layer for sufficient spreading of current. As a result thereof, the absorption loss of light by metals is reduced even more.

Yet another semiconductor light emitting device according to the present disclosure has reduced light absorption by suitably combining island-type connecting electrodes with extending-type connecting electrodes, such that the length and area of these connecting electrodes may not be increased more than necessary.

Yet another semiconductor light emitting device according to the present disclosure has improved brightness by reflecting light that has passed through even the non-conductive reflective film towards the additional reflective film.

Yet another semiconductor light emitting device according to the present disclosure has the first and second lower electrodes which provide an improved electrical contact (e.g., which reduce a contact resistance) between the connecting electrodes and the first semiconductor layer, and between the connecting electrodes and the light transmitting conductive film, respectively, as compared with a case where an electrical contact may not be desirable since the first and second electrodes come into direct contact with the first semiconductor layer or the light transmitting conductive layer through an opening.

Yet another semiconductor light emitting device according to the present disclosure prevents degradation of an electrical contact which results from the adversely affected top of the lower electrode by a process of forming an opening in the non-conductive reflective film.

What is claimed is:

1. A semiconductor light emitting device comprising:
a plurality of semiconductor layers sequentially formed on a growth substrate, the plurality of semiconductor layers including a first semiconductor having a first conductivity type, a second semiconductor layer having a second conductivity type different from the first conductivity type, and an active layer interposed between the first and second semiconductor layers and adapted to generate light by electron-hole recombination;
a non-conductive reflective film which is formed on the plurality of semiconductor layers, and reflects the light generated from the active layer towards the growth substrate;
a first electrode which is formed on the non-conductive reflective film, and electrically communicates with the first semiconductor layer to provide the first semiconductor layer with either electrons or holes; and
a second electrode which is formed on the non-conductive reflective film, opposite to the first electrode, and electrically communicates with the second semiconductor layer to provide the second semiconductor layer with either electrons if holes are provided to the first semiconductor layer or holes if electrons are provided to the first semiconductor layer,
wherein at least one of the first electrode and the second electrode has a plurality of sub-electrodes on the non-conductive reflective film, with the sub-electrodes being spaced from each other.

2. The semiconductor light emitting device according to claim 1, wherein the non-conductive reflective film comprises a Distributed Bragg Reflector.

3. A semiconductor light emitting device comprising:
a plurality of semiconductor layers sequentially formed on a growth substrate, the plurality of semiconductor layers including a first semiconductor having a first conductivity type, a second semiconductor layer having a second conductivity type different from the first conductivity type, and an active layer interposed between the first and second semiconductor layers and adapted to generate light by electron-hole recombination;
a non-conductive reflective film which is formed on the plurality of semiconductor layers, and reflects the light generated from the active layer towards the growth substrate;
a first electrode which is formed on the non-conductive reflective film, and electrically communicates with the first semiconductor layer to provide the first semiconductor layer with either electrons or holes;
a second electrode which is formed on the non-conductive reflective film, opposite to the first electrode, and electrically communicates with the second semiconductor layer to provide the second semiconductor layer with either electrons if holes are provided to the first semiconductor layer or holes if electrons are provided to the first semiconductor layer, wherein the first electrode and the second electrode each comprise a reflective layer in contact with the non-conductive reflective film;
a barrier layer on the reflective layer; and
a bonding layer on the barrier layer.

4. A semiconductor light emitting device comprising:
a plurality of semiconductor layers sequentially formed on a growth substrate, the plurality of semiconductor layers including a first semiconductor having a first conductivity type, a second semiconductor layer having a second conductivity type different from the first conductivity type, and an active layer interposed between the first and second semiconductor layers and adapted to generate light by electron-hole recombination;

a non-conductive reflective film which is formed on the plurality of semiconductor layers, and reflects the light generated from the active layer towards the growth substrate;

a first electrode which is formed on the non-conductive reflective film, and electrically communicates with the first semiconductor layer to provide the first semiconductor layer with either electrons or holes;

a second electrode which is formed on the non-conductive reflective film, opposite to the first electrode, and electrically communicates with the second semiconductor layer to provide the second semiconductor layer with either electrons if holes are provided to the first semiconductor layer or holes if electrons are provided to the first semiconductor layer;

an insulating film formed between the non-conductive reflective film and the first and second electrodes;

a first connecting electrode and a second connecting electrode formed between the non-conductive reflective film and the insulating film;

a first lower electrical connection which passes through the non-conductive reflective film and electrically connects the first connecting electrode and the first semiconductor layer;

a second lower electrical connection which passes through the non-conductive reflective film and electrically connects the second connecting electrode and the second semiconductor layer;

a first upper electrical connection which passes through the insulating film and is connected with the first connecting electrode; and a second upper electrical connection which passes through the insulating film and is connected with the second connecting electrode.

5. The semiconductor light emitting device according to claim 4, wherein the non-conductive reflective film comprises a Distributed Bragg Reflector.

* * * * *